United States Patent
Van Der Kolk

(10) Patent No.: US 11,450,781 B2
(45) Date of Patent: Sep. 20, 2022

(54) $TM^{2+}$ LUMINESCENT MATERIALS FOR SOLAR RADIATION CONVERSION DEVICES

(71) Applicant: Technische Universiteit Delft, Delft (NL)

(72) Inventor: Erik Van Der Kolk, Delft (NL)

(73) Assignee: PHYSEE Group B.V., Delft (NL)

( * ) Notice: Subject to any disclaimer, the term of this patent is extended or adjusted under 35 U.S.C. 154(b) by 237 days.

(21) Appl. No.: 15/024,283

(22) PCT Filed: Aug. 28, 2014

(86) PCT No.: PCT/NL2014/050585
§ 371 (c)(1),
(2) Date: Mar. 24, 2016

(87) PCT Pub. No.: WO2015/047084
PCT Pub. Date: Apr. 2, 2015

(65) Prior Publication Data
US 2016/0233365 A1    Aug. 11, 2016

(30) Foreign Application Priority Data

Sep. 26, 2013  (NL) .................................... 2011507

(51) Int. Cl.
*H01L 31/055* (2014.01)
*C09K 11/77* (2006.01)
*H01L 31/18* (2006.01)

(52) U.S. Cl.
CPC ........ *H01L 31/055* (2013.01); *C09K 11/7705* (2013.01); *H01L 31/18* (2013.01); *Y02E 10/52* (2013.01); *Y02E 10/549* (2013.01)

(58) Field of Classification Search
CPC .... H01L 31/055; C09K 11/7705; Y02E 10/52
See application file for complete search history.

(56) References Cited

U.S. PATENT DOCUMENTS

2004/0095658 A1 *  5/2004  Buretea .................. B82Y 20/00
                                                  359/853
2009/0196828 A1    8/2009  Suijver
(Continued)

FOREIGN PATENT DOCUMENTS

CN          101942306 A       1/2011
CN          102268261 A       12/2011
(Continued)

OTHER PUBLICATIONS

J. Grimm et al., (Upconversion between 4f-5d Excited States in Tm2+ doped CsCaCl3, CsCaBr3, and CsCaI3), 2007.*
(Continued)

*Primary Examiner* — Niki Bakhtiari
(74) *Attorney, Agent, or Firm* — St Onge Steward Johnston and Reens LLC

(57) ABSTRACT

A solar radiation conversion device is described that uses a luminescent $Tm^{2+}$ inorganic material for converting solar radiation of at least part of the UV and/or visible and/or infrared solar spectrum into infrared solar radiation, preferably the infrared solar radiation having a wavelength of around 1138 nm; and, a photovoltaic device for converting at least part of the infrared solar radiation into electrical power.

22 Claims, 12 Drawing Sheets

(56) References Cited

U.S. PATENT DOCUMENTS

| | | | |
|---|---|---|---|
| 2010/0180932 A1* | 7/2010 | Wang | H01L 31/055 136/246 |
| 2011/0126889 A1 | 6/2011 | Bourke, Jr. et al. | |
| 2013/0098438 A1* | 4/2013 | Kawai | H01L 31/055 136/256 |

FOREIGN PATENT DOCUMENTS

| | | |
|---|---|---|
| CN | 102683467 A | 9/2012 |
| CN | 103311326 A | 9/2013 |
| GB | 2407568 A | 5/2005 |
| JP | 2010501544 A | 1/2010 |
| JP | 2012511827 A | 5/2012 |
| WO | 2010067296 A1 | 6/2010 |
| WO | 2011155614 A1 | 12/2011 |
| WO | 2013001402 A2 | 1/2013 |

OTHER PUBLICATIONS

Grimm et al. (4f-4f and 4f-5d excited states and luminescence properties of Tm2+-doped CaF2, CaCl2, SrCl2 and BaCl2).*

Judith Grimm, Light-Emission and Excited-State Dynamics in Tm2+ Doped CsCaCl3, CsCaBr3,and CsCaI3, J. Phys. Chem. B, 2016, vol. 110, p. 2093-2101.

Judith Grimm, "Cristal absorption spectra in the region of 4f-4f and 4f-5d excitations in Tm2+-doped CsCaCl3, CsCaBr3,and CsCaI3", Inorganic Chemistry, 2006, vol. 45, No. 26, pp. 10905-10908.

Office Action Summary dated Sep. 19, 2017 Application No. 2016-516569 Applicant—Technische Universiteit Delft 1 page.

Boulon, "Luminescence in glassy and glass ceramic materials", Materials Chemistry and Physics, vol. 16, Issues 3-4, Feb. 16, 1987, pp. 301-347.

Richards, "Luminescent layers for enhanced silicon solar cell performance: Down-conversion", Solar Energy Materials and Solar Cells, vol. 90, Issue 9, May 23, 2006, pp. 1189-1207.

Strümpel, et al., "Modifying the solar spectrum to enhance silicon solar cell efficiency—An overview of available materials", Solar Energy Materials and Solar Cells, vol. 91, Issue 4, Feb. 15, 2007, pp. 238-249.

Office Action of the Canadian Patent Office for Application No. 2,925,418 dated Jul. 8, 2021, 5 pages.

Fudith Grimm, "New Light Emitting Materials: Synthesis, Optical Spectroscopy, Photon Upconversion and Photoionization in Ni2*, Ce3* and Tm2* Doped Halides", inauguraldissertation der Philosophisch-natururissenschaftlichen Fakulttit der Universitiit Bern, https://biblio.unibe.chidownload/eldiss/06grimmj.pdf#page=49, Feb. 3, 2006 (Feb. 3, 2006).

Office Action from Korean Patent Office for Application No. 2016-7008613 dated Feb. 24, 2021.

Office Action from Canadian Patent Office for Application No. 2,925,418 dated Aug. 20, 2020.

Office Action from Brazilian Patent Office for Application No. BR112016006163-2 dated Jun. 16, 2020; English translation included (5 pages).

First Examination Report from Indian Patent Office for Application No. 201637014073 dated Jun. 30, 2020 (5 pages).

* cited by examiner

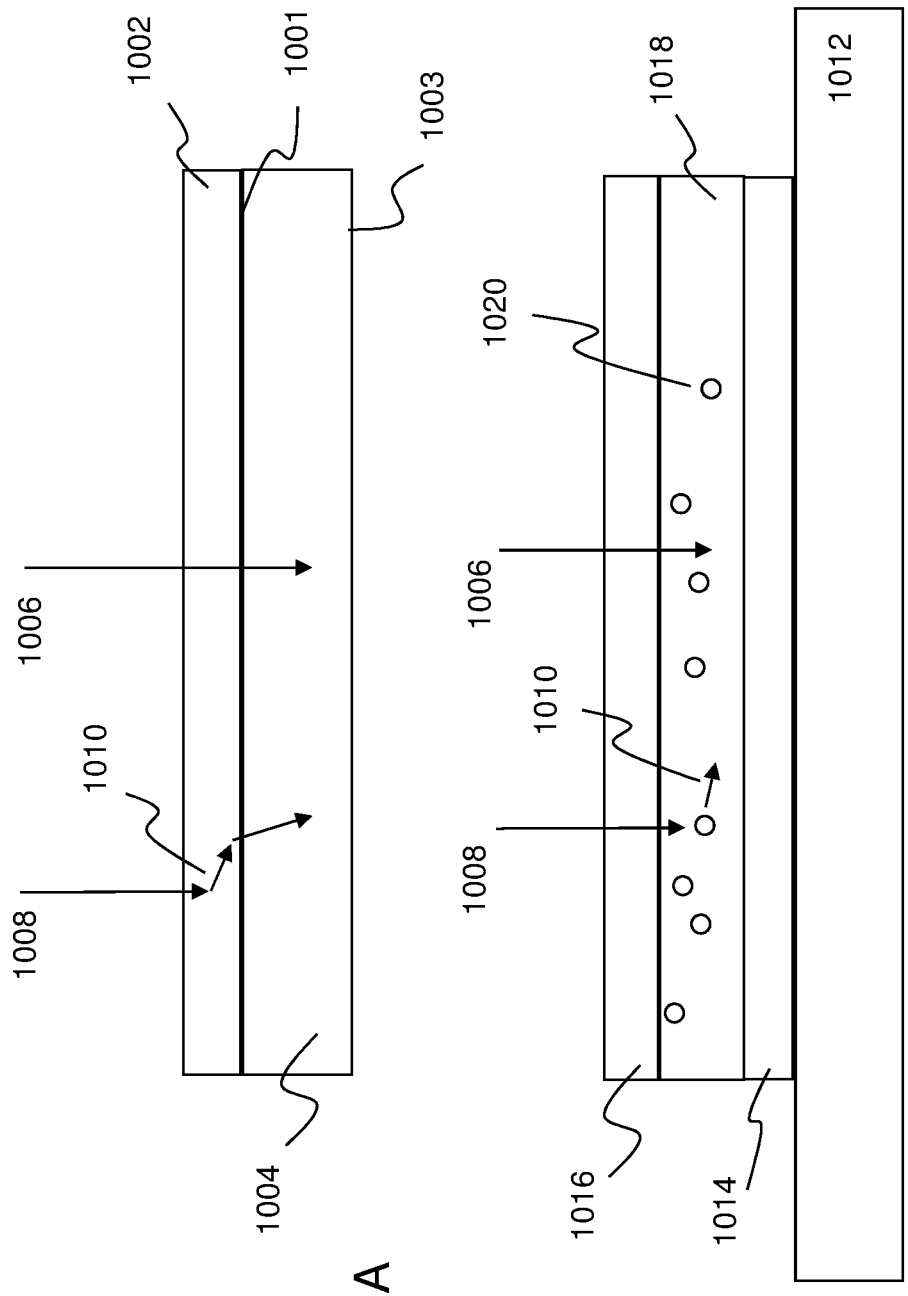

/ # TM²⁺ LUMINESCENT MATERIALS FOR SOLAR RADIATION CONVERSION DEVICES

FIELD OF THE INVENTION

The invention relates to broadband-absorbing $Tm^{2+}$ luminescent materials for solar radiation conversion devices, and, in particular, though not exclusively, solar radiation conversion devices such as photovoltaic cells or luminescent solar concentrators that comprise a broadband-absorbing $Tm^{2+}$ luminescent material, the use of $Tm^{2+}$ luminescent materials in solar radiation conversion devices, methods of synthesizing $Tm^{2+}$ based luminescent materials and a method for forming a $Tm^{2+}$ luminescent (poly)crystalline thin-film layer on a substrate.

BACKGROUND OF THE INVENTION

Solar radiation conversion devices such as luminescent solar concentrators (LSCs) aim at lowering cost of solar energy generation by concentrating sunlight using a cheap luminescent plate onto small area strip photovoltaic cells. In such scheme sun light is absorbed by a luminescent material and re-emitted in all directions. A considerable fraction of the light is trapped in the plate that acts as a light guide by total internal reflection. This way the light is guided to the perimeter where photovoltaic cells convert it into electric power. Similarly, simple luminescent conversion layers (LCL) on top of or integrated in a photovoltaic device, e.g. a solar cell, may be used to increase the overall conversion efficiency of the device. In such scheme (part of the) sun light is absorbed by a luminescent material and re-emitted in all directions. A considerable fraction of the light is coupled into the device either directly or indirectly by total internal reflection. This way the absorption efficiency in the cell is enhanced due to an enhanced optical path length.

While solar panels are already contributing to the world energy production, LSCs and LCLs are still not commercially available. Although the concept is appealing, the production of large sized LSCs and LCLs with sufficient efficiency turns out to be a real challenge. The problems that are encountered mainly concern the shortcomings associated with the luminescent materials that are used in an LSC or LCL.

Ideally, a luminescent material for an LSC or LCL should meet certain requirements. The material should have: a broad spectral absorption, a high absorption efficiency over the whole absorption spectrum, non-overlapping absorption and emission spectra (i.e. a large Stokes' shift), a high luminescent quantum efficiency (percentage of absorbed photons that lead to a newly emitted photon), a photon emission that matches the spectral response of the PV-cell it is coupled to and it should be compatible with materials that form the waveguide.

The most common luminescent material that is used for LSCs are organic dyes. These materials are relatively cheap, easily produced and can be integrated into a waveguide structure in a simple way. The width of their absorption spectrum however is limited and the absorption and emission spectra overlap resulting in substantial losses due to self-absorption.

An interesting group of luminescent materials that are currently investigated for applications in LCSs are the inorganic rare-earth compounds. These materials can exhibit relatively large shifts between absorption and emission. For example, in the article by De Boer et al, "Progress in phosphors and filters for luminescent solar concentrators", 1202, a phosphor based on $Sm^{2+}$ is described that exhibits emission around 700 nm and absorption edge below 600 nm.

Although this material looks promising in view of the re-absorption problems of the conventional dyes, the absorbing properties are relatively poor as it only covers a part of the total solar spectrum that is available for conversion. Hence there is a need for improved luminescent materials that both exhibit broadband absorption (i.e. absorption over a large part of the solar spectrum), little self-absorption and an emission spectrum that may be easily matched with photovoltaic devices.

SUMMARY OF THE INVENTION

It is an objective of the invention to reduce or eliminate at least one of the drawbacks known in the prior art. In a first aspect the invention may relate to a solar radiation conversion device comprising a $Tm^{2+}$ based inorganic luminescent material for converting solar radiation of at least part of the UV and/or visible and/or infrared solar spectrum into infrared solar radiation, preferably said infrared solar radiation having a wavelength of around 1138 nm; and, a photovoltaic device for converting at least part of said infrared solar radiation into electrical power.

The $Tm^{2+}$ based inorganic luminescent material exhibits a large Stoke's shift so the problem of self-absorption in the solar radiation conversion device does not occur. The $Tm^{2+}$ based inorganic luminescent material absorbs more than twice the amount of power from the sunlight spectrum when compared to absorption of solar radiation of conventional luminescent materials such as dyes. Contrary to the well-known dye's, $Tm^{2+}$ based luminescent materials are colourless which enhances applicability in the build environment. Further, the infrared emission peak at 1138 nm of the $Tm^{2+}$ based inorganic luminescent materials advantageously coincides with the 1.13 eV bandgap for optimal conversion of the broad solar spectrum (in particular the AMI1.5 solar spectrum) on the basis of a single-junction cell. This feature allows for improving the overall conversion efficiency of a LSC or LCL.

In an embodiment, said luminescent material may comprise a binary, ternary and/or a quaternary inorganic crystalline host material that is doped with $Tm^{2+}$ ions. In an embodiment said luminescence (emission) originations from $Tm^{2+}$ ions. In another embodiment, said $Tm^{2+}$ ions is present in a concentration between 0.1 and 100%. In yet another embodiment, in a concentration between 1% and 90%. In a further embodiment, between 1% and 50% an in yet a further embodiment between 0.2% and 11%.

In an embodiment, said binary inorganic host material may be defined by the general formula ML wherein M=Na, K,Rb,Cs and L=Cl,Br,I. In another embodiment, binary inorganic host material may be defined by the general formula $NL_2$ wherein N=Mg,Ca,Sr,Ba and L=Cl,Br,I,F. In yet another embodiment, said binary inorganic host material may be defined by the general formula $NI_2$ wherein N=Mg, Ca,Sr,Ba. Many host materials may be used for the $Tm^{2+}$ ions. It has been found that in particular $CaI_2$ or NaI may be used as $Tm^{2+}$ inorganic luminescent converter material. These materials exhibit superior absorption characteristics for the solar spectrum.

The host materials may also be an alloy or mixture described by the general formula $M1_{(1-x)}M2_{(x)}L$ with M1 and M2 any of the elements M, or $ML1_{(1-x)}L2_{(x)}$ with L1 and L2 any of the elements L. The host materials may also be an alloy or mixture of the general formula $M1_{(1-x)}M2_{(x)}L1_{(1-y)}$ L2$_{(y)}$. The host materials may also be an alloy or mixture of 3 or more elements M or L. The host materials may also be an alloy or mixture of the general formula N1$_{(1-x)}$N2$_{(x)}$L2 with N1 and N2 any of the elements N, or NL1$_{(1-x)}$L2$_{(x)}$ with L1 and L2 any of the elements L. The host materials may also be an alloy or mixture of the general formula N1$_{(1-x)}$N2$_{(x)}$L1$_{(1-y)}$L2$_{(y)}$. The host materials may also be an alloy or mixture of 3 or more elements N or L.

In an embodiment, said luminescent Tm$^{2+}$ doped inorganic material may comprise a (poly)crystalline thin-film layer or crystalline particles, preferably nanoscale particles, wherein said particles are embedded in a matrix material. Tm$^{2+}$ based inorganic luminescent material may be synthesized using different methods, including deposition methods that are compatible with conventional semiconductor processing methods so that the Tm$^{2+}$ based inorganic luminescent material may be easily integrated in thin-film photovoltaic devices.

In an embodiment said luminescent Tm$^{2+}$ doped inorganic material may be part of or associated with a waveguide structure for guiding said solar radiation of a predetermined wavelength to said photovoltaic device.

In an embodiment, said waveguide structure may comprise a first (top) surface and a second (bottom) surface, wherein a luminescent Tm$^{2+}$ layer is provided over at least part of said first and/or second surface, preferably said layer comprising a (poly)crystalline thin-film layer or a layer of a matrix material in which crystalline (nanosized) particles are embedded. Here, the term nano-sized particles may refer to particles that have an average size of selected between 1 and 1000 nm, preferably between 2 and 800 nm, more preferably between 3 and 500 nm. In a further embodiment, the particles may be selected between 25 and 600 nm, preferably between 50 and 200 nm. The nanosized particles provide the effect that the losses due to scattering in the device are reduced.

In an embodiment, said waveguide structure may comprise a first (top) surface and a second (bottom) surface, wherein said luminescent Tm$^{2+}$ material may be embedded e.g. as (nanosized) particles in said waveguide structure. In an embodiment said matrix material may be a transparent organic polymer. In an embodiment, said transparent organic polymer may be a poly(methyl methacrylate) (PMMA) or a polycarbonate. Hence, the Tm$^{2+}$ based inorganic material as especially suitable for use in luminescent solar energy concentrator.

In an embodiment, said solar radiation conversion devices comprises a wavelength conversion layer wherein said luminescent Tm$^{2+}$ inorganic material is provided over a light receiving face of said photovoltaic device. In an embodiment said photovoltaic device may comprise said luminescent Tm$^{2+}$ inorganic material. In an embodiment, said photovoltaic device may comprise a thin-film layer comprising said luminescent Tm$^{2+}$ inorganic material.

In an embodiment, said photovoltaic device may comprise an infrared absorbing active layer, more preferably said infrared absorbing layer comprising at least one of: a type IV, III-V, or II-VI semiconductor compound, copper indium gallium (di)selenide (CIGS), copper indium (di)selenide (CIS), infra-read absorbing quantum dots, an infrared absorbing polymer, graphene or (carbon) nanotubes. Hence, the Tm$^{2+}$ based inorganic material may be used to extend the efficiency of a simple infrared photovoltaic device thereby effectively converting the infrared photovoltaic device into broad-band solar radiation conversion device.

In an embodiment, in said Tm$^{2+}$ luminescent material solar radiation absorption takes place in the 5d configurations (5d states) of Tm$^{2+}$ while the emission (luminescence) is from the Tm$^{2+}$ 4f$^{13}$($^2$F$_{5/2}$) to the Tm$^{2+}$ 4f$^{13}$($^2$F$_{7/2}$) ground state.

In a further aspect, the invention may relate to the use of a luminescent Tm$^{2+}$ inorganic crystalline material in a luminescent solar energy concentrator or a solar cell.

In another aspect, the invention may relate to a method for synthesising a luminescent Tm$^{2+}$ doped inorganic crystalline material, wherein the method may comprise: melting an amount of at least a first inorganic ionic compound with a second inorganic ionic compound, said second ionic compound comprising a Tm$^{2+}$ cation in order to form a Tm$^{2+}$ doped a first ionic compound; and, during said melting maintaining the pressure below 5·$^{-4}$ mbar, preferably below 1·$^{-4}$ mbar.

In yet another aspect, the invention may relate to a method of forming a luminescent Tm$^{2+}$ doped inorganic polycrystalline thin-film on a substrate, wherein the method may comprise: providing a first sputtering target with first sputtering material comprising a first inorganic ionic compound and a second sputtering target with a second sputtering material is thulium; introducing a gas into the sputtering chamber; heating said substrate to a temperature between 10 and 700° C., preferably 10 and 600° C.; and, applying an RF electric potential to said first sputtering target and a DC electric potential to said second sputtering target, thereby causing sputtering of said first and second material from said first and second targets onto said substrate in order to grow a (poly)crystalline thin-film of said first inorganic ionic compound that is doped with Tm$^{2+}$ cations.

The invention will be further illustrated with reference to the attached drawings, which schematically will show embodiments according to the invention. It will be understood that the invention is not in any way restricted to these specific embodiments.

BRIEF DESCRIPTION OF THE DRAWINGS

FIGS. 10A and 10B depict cross-sections of schematic solar radiation conversion devices according to another embodiment of the invention.

DETAILED DESCRIPTION

In this disclosure divalent thulium ($Tm^{2+}$) based inorganic luminescent materials are described that have superior and improved properties when compared to other rare-earth doped phosphors and other luminescent materials for use in luminescent solar concentrator (LSC) or spectral conversion layer on thin-film solar cells devices that are known in the prior art.

It has been surprisingly found that certain inorganic crystalline host material comprising $Tm^{2+}$ (e.g. $Tm^{2+}$ doped phosphors) exhibit absorbing and luminescent properties that can be advantageously used in LSC devices or SCL's. In particular, it has been found that the $Tm^{2+}$ doped inorganic crystalline materials may absorb the UV and visible part and at least part of the IR part of the solar spectrum (in total more than 60% of the power from the sun) and have a sharp 4f-4f peak emission in the infra-red around 1138 nm. As a result of the large Stokes' shift, the problem of self-absorption does not occur.

Moreover, the infrared emission peak at 1138 nm advantageously coincides with the 1.13 eV bandgap for optimal conversion of the broad solar spectrum (in particular the unconcentrated AM1.5 solar spectrum) on the basis of a single-junction cell. As will be described hereunder in more detail, this feature allows for improving the overall conversion efficiency of simple single-junction solar cells.

Figure 1A:
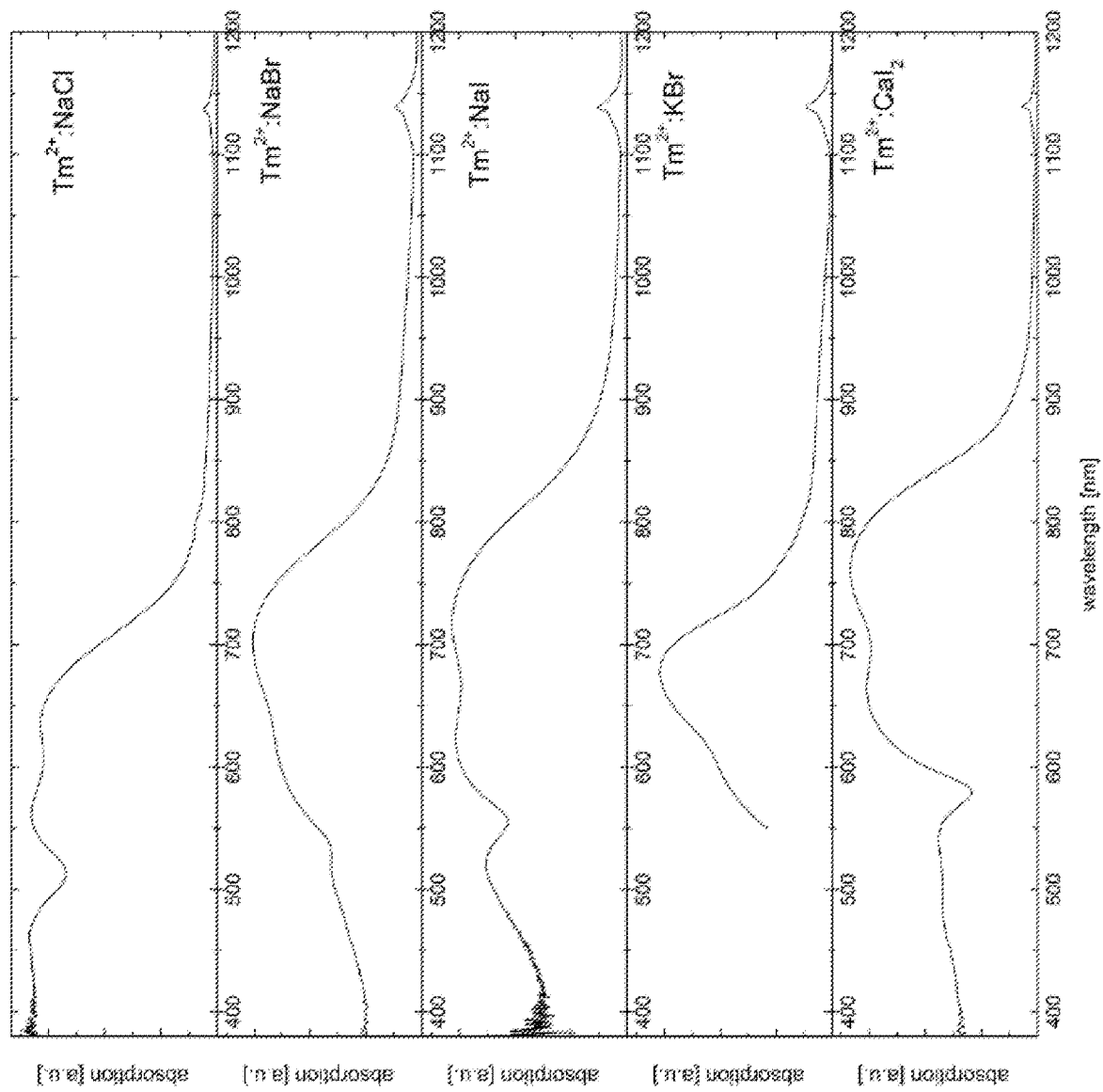
FIG. 1A-1C depict the absorption, excitation and emission spectra of Tm$^{2+}$ doped inorganic materials according to various embodiments of the invention.
Figure 1B:
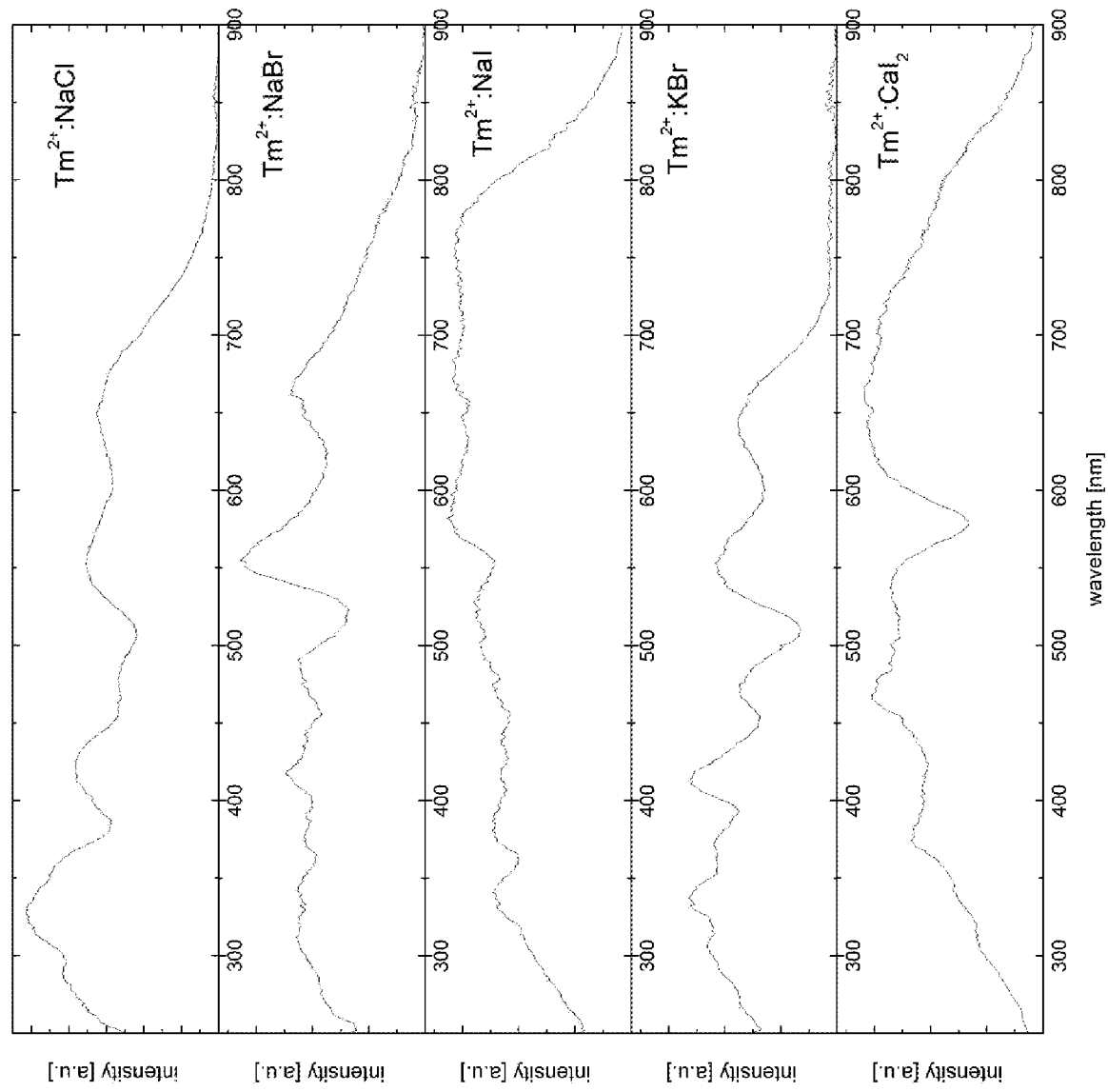
Figure 1C:
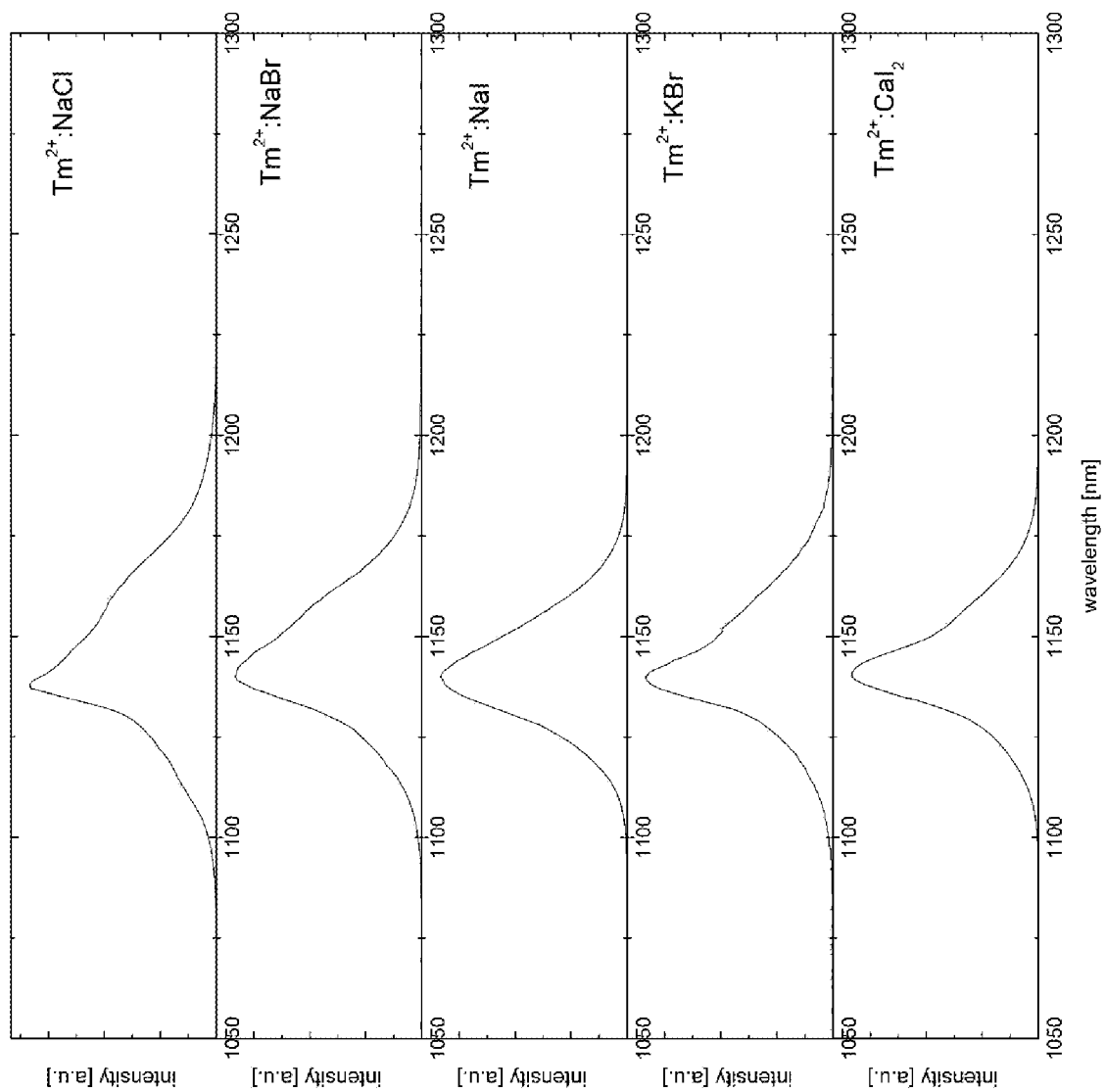

FIG. 1A-1C depict absorption, excitation and emission spectra of doped inorganic materials according to various embodiments of the invention. In particular, FIG. 1A depicts the absorption spectra of $Tm^{2+}$ doped NaCl, NaI, $CaI_2$, NaBr and KBr. The spectra exhibit clear crystal-lattice dependent d-band absorption in the VIS and IR. Furthermore, a weak absorption peak of the parity forbidden 4f-4f absorption around 1138 nm is shown that is relatively independent of the type of host lattice.

In an embodiment, the luminescent material may comprise an inorganic crystalline material (which may hereafter be referred to as the inorganic host material) that is doped with $Tm^{2+}$. The inorganic host material may be a binary inorganic host material defined by the general formula ML wherein M=Na,K,Rb,Cs and wherein L=Cl,Br,I. These materials include (but are not limited to) NaCl, NaBr, NaI, KCl, KBr, KI, CsCl, CsBr, CsI, RbCl, RbBr, RbI, etc. These materials crystallize at relatively low temperatures (e.g. room temperature) thereby allowing easy formation of $Tm^{2+}$ doped thin films.

The host materials may also be an alloy or mixture of the general formula $M1_{(1-x)}M2_{(x)}L$ with M1 and M2 any of the elements M, or $ML1_{(1-x)}L2_{(x)}$ with L1 and L2 any of the elements L. The host materials may also be an alloy or mixture of the general formula $M1_{(1-x)}M2_{(x)}L1_{(1-y)}L2_{(y)}$. The host materials may also be an alloy or mixture of 3 or more elements M or L.

In another embodiment, a binary inorganic host material may be defined by the general formula $NL_2$ wherein N=Mg, Ca,Sr,Ba and L=Cl,Br,I,F. These materials may include (but are not limited to) $CaCl_2$, $CaBr_2$, $CaI_2$, $SrCl_2$, $SrBr_2$, $SrI_2$, $BaCl_2$, $BaBr_2$, $BaI_2$, $CaF_2$, $SrF_2$, $BaF_2$.

The host materials may also be an alloy or mixture of the general formula $N1_{(1-x)}N2_{(x)}L_2$ with N1 and N2 any of the elements N, or $NL1_{(2-2x)}L2_{(2x)}$ with L1 and L2 any of the elements L. The host materials may also be an alloy or mixture of the general formula $N1_{(1-x)}N2_{(x)}L1_{(2-2y)}L2_{(2y)}$. The host materials may also be an alloy or mixture of 3 or more elements N or L.

In an advantageous embodiment, binary iodine inorganic carrier materials given by the general formula $NI_2$ N=Mg, Ca,Sr,Ba may be used as the luminescent inorganic converter material. The $Tm^{2+}$ doped iodines exhibit surprisingly good absorption characteristics for the solar spectrum.

In a particular advantageous embodiment $CaI_2$ or NaI may be used as $Tm^{2+}$ inorganic luminescent converter material. It has been surprisingly found that these materials exhibit superior absorption characteristics for the solar spectrum.

In a further embodiment, a ternary inorganic host material may be used. These ternary materials may include (but are not limited to) $CsCaCl_3$, $CsCaBr_3$, $CsCaI_3$, $RbCaCl_3$, $RbCaBr_3$, $RbCaI_3$, $CsSrBr_3$, $CsSrI_3$, $CsBaBr_3$, $CsBaI_3$, $RbSrI_3$, $KSrI_3$.

It is submitted that the invention in not limited to the above-mentioned inorganic host materials. For example, in an embodiment the invention may also include mixed and/or alloyed forms of the above-mentioned inorganic host materials.

The spectra of FIG. 1A show clear 4f-5d ($4f^{13} \rightarrow 4f^{12}(5d)^1$) absorption bands in the visible range of the spectrum, together with $4f^{13}$-$4f^{13}$ ($^2F_{7/2} \rightarrow ^2F_{5/2}$) absorption in the infrared. The latter absorption bands are relatively independent of the type of inorganic host material. In contrast, the absorption by the 4f-5d transitions are strongly depends on the type of inorganic host material in which Tm2+ is present. Mechanisms that determine the 4f-5d transition energy range are determined by the average (centroid) energy and the total crystal field splitting of the 5d-configuration. It appears that the nearest coordination shell of anions around $Tm^{2+}$ determines both aspects. Crystal field splitting is determined by the size and shape of the anion polyhedron. It scales with the the distance to the anions. The centroid shift is strongly determined by the chemical (covalence) and physical (polarizability) properties of the anion ligands.

The broadness of the absorption spectra of the different materials may be further illustrated by the absorption edges of the materials. There the absorption edge may be determined as the wavelengths for with the absorption is 25% of the maximum absorption of the lowest energy 5d state of $Tm^{2+}$. In the table hereunder the absorption edge for different $Tm^{2+}$ doped inorganic materials together with their refractive indices are provided:

| Luminescent material | absorption edge [nm] | refractive index |
|---|---|---|
| $Tm^{2+}$:NaCl | 710 | 1.53 |
| $Tm^{2+}$:$CaI_2$ | 844 | 1.78 |
| $Tm^{2+}$:NaI | 831 | 1.74 |
| $Tm^{2+}$:NaBr | 810 | 1.62 |
| $Tm^{2+}$:KBr | 763 | 1.54 |

From the table and the absorption spectra it follows that the $Tm^{2+}$ doped materials exhibit broadband absorption over a range between 200 nm and 900 nm, preferably 220 and 880 nm, more preferably 240 and 860 nm.

FIG. 1B depicts the excitation spectra of the $Tm^{2+}$ doped inorganic materials. The spectra were measured at an emission wavelength of 1138 nm (i.e. at the top of the emission spectra as depicted in FIG. 1C).

FIG. 1C depicts the emission spectra corresponding to emission associated with the $^2F_{5/2} \rightarrow ^2F_{7/2}$ transition of $Tm^{2+}$ doped NaCl, NaI, $CaI_2$, NaBr and KBr under 410, 412, 477, 480 and 409 nm excitation respectively. As expected, the transition is relatively independent of the type of host lattice. Further, the graphs reveal that electrons that are excited to a d-band state relax to the $^2F_{5/2}$ state from where radiative relaxation to the $^2F_{7/2}$ state takes place. The resulting Stokes-shift between absorption in the UV and visible range of the spectrum and the sharp peak emission in the infrared very well meets the requirements of a luminescent material that is suitable for LSC or SCL applications.

Figure 2:
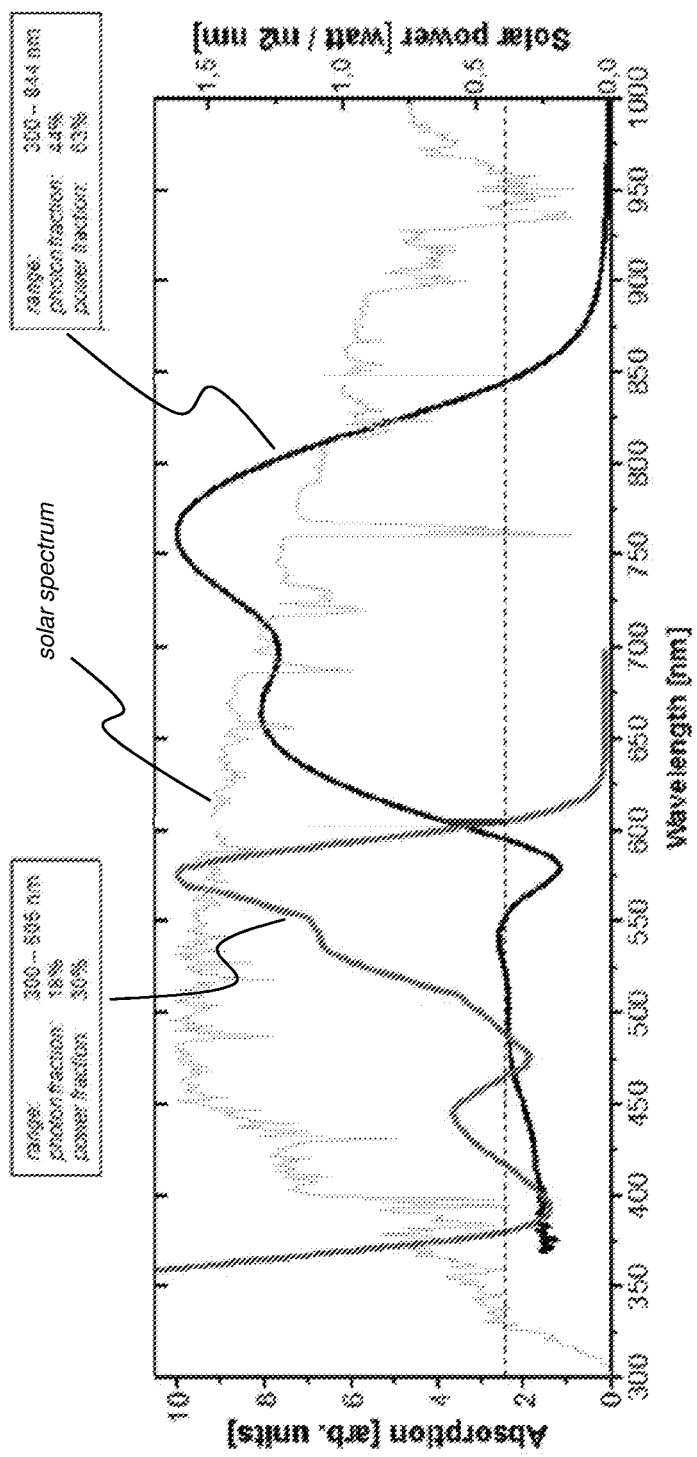
FIG. 2 depicts the absorption spectra of the Red305 dye and the absorption spectrum of Tm$^{2+}$ doped CaI$_2$.

The absorption spectra of these materials are substantially superior when compared to absorption spectra of conventional luminescent materials such as dyes. FIG. 2 depicts the absorption spectra of the Red305 dye and the absorption spectrum of $Tm^{2+}$ doped $CaI_2$. The solar spectrum as measured on the earth's surface is depicted in the background. The figure shows that the absorption edge of the dye is around 605 nm whereas the absorption edge of $Tm^{2+}$ doped $CaI_2$ is around 844 nm. Further, the dye absorbs a 30% power fraction of the total solar intensity corresponding to a photon fraction (i.e. the percentage of photons absorbed) of only 18%, whereas $Tm^{2+}$ doped $CaI_2$ has a power fraction of around 63%, i.e. twice the amount of power compared to the dye, corresponding to a photon fraction of 44%. This figure thus shows that the $Tm^{2+}$ doped materials exhibit substantially superior LCS properties when compared to the state-of-the-art dyes that are currently used for LCS.

Figure 3:
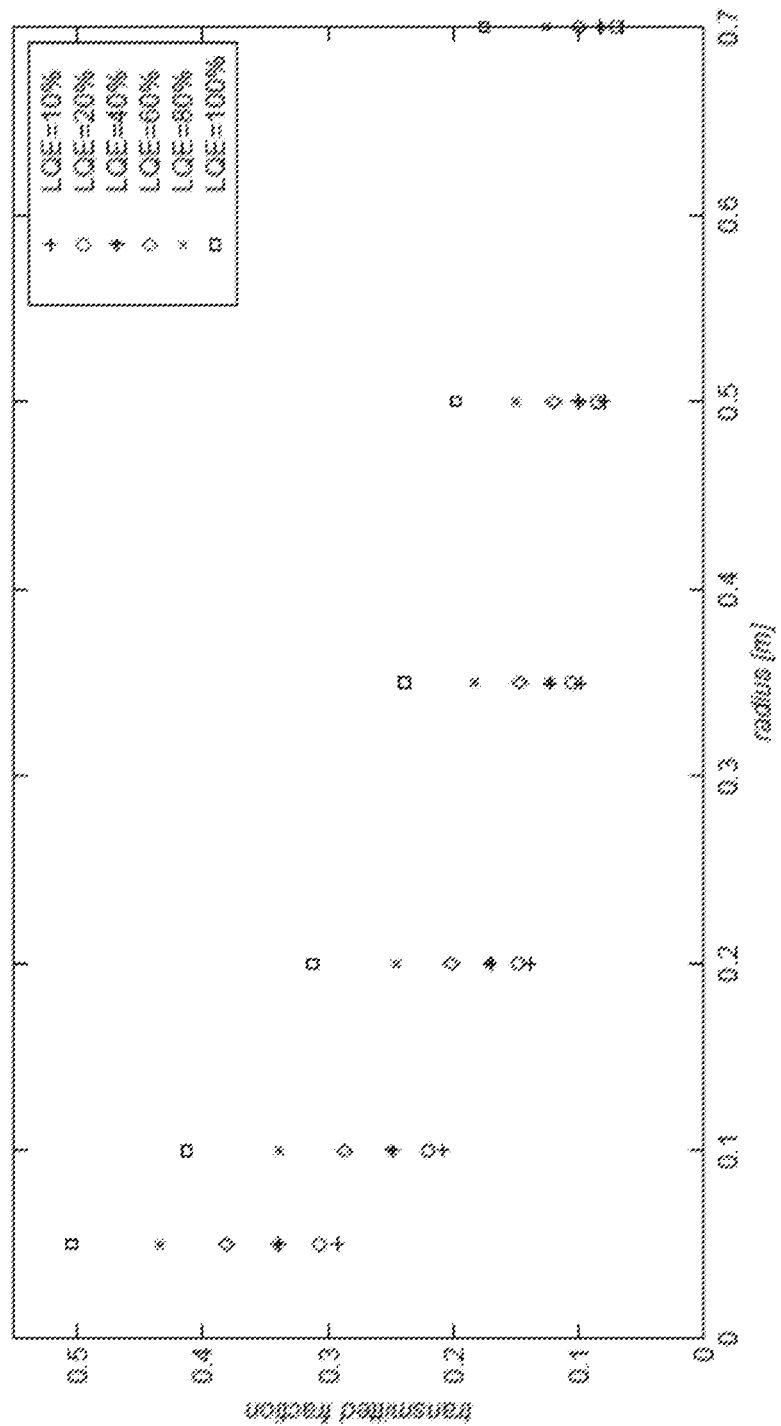
FIG. 3 depicts the loss factor due to self-absorption of a Red305 dye as a function of the diameter of a circular LCS.

FIG. 3 depicts the loss factor due to self-absorption for a Red305 dye as a function of the LSC radius for different LQEs (the loss factor equals 1 minus the transmitted fraction). The fraction of the initially emitted energy that is transmitted through the edges of a circular LSC with a refractive index of 1.5 is depicted for different radii and LQEs. This figures shows that even for a dye with an LQE of 100%, only 20% of the luminescent light is transmitted out of the edges of an LCS with a radius of around 0.56 meter. When lowering the LQE to 80%, only 10% of the luminescent light is transmitted out of the edges of the LCS. This trend is also valid for other dyes or luminescent materials that are based on nano-particles and that exhibit self-absorption. These losses due to self-absorption are eliminated by using luminescent $Tm^{2+}$ doped inorganic materials according to the invention in an LSC structure.

The syntheses of $Tm^{2+}$ doped materials is problematic as often $Tm^{3+}$ instead of $Tm^{2+}$ sites are formed in the inorganic host material. For example, the use of a conventional firing process in a reducing $N_2/H_2$ atmosphere does not result in stable $Tm^{2+}$ doped materials. Instead, the $Tm^{3+}$ state is formed. For example, heating a mixture of the salt and $TmI_2$ or $TmCl_3$ in an alumina crucible in a tube furnace with $N_2/H_2$ atmosphere at different temperatures (below and above the melting point of the salts) resulted in the formation of $Tm_2O_3$ or $Tm^{3+}$ doped $CaI_2$ or NaCl (according to XRD analyses) and the diffuse reflectance spectra showed the presence of $Tm^{3+}$ rather than $Tm^{2+}$.

Therefore, in order to obtain $Tm^{2+}$ doped inorganic materials that exhibit the above-described advantageous absorption-emission characteristics, a mixture of an inorganic host material (e.g. NaCl) and a $Tm^{2+}$-based salt (e.g. $TmI_2$) was contained in a closed quartz ampoule that was under vacuum. The doping concentration of the $Tm^{2+}$ may be varied on the basis of the amount of $Tm^{2+}$-based salt in the mixture. Heating the ampoule in a furnace however resulted in the formation of $Tm^{3+}$ formation and no $Tm^{2+}$ was found. However, heating the ampoule (with the mixture inside) with a gas burner (a burner that is normally used to melt the quartz) resulted in the formation of $Tm^{2+}$ doped NaCl. On the basis of this process, different $Tm^{2+}$ doped inorganic materials were successfully synthesized, including (but not limiting to) $Tm^{2+}$ doped NaBr, NaI, KBr, $CaCl_2$ and $CaI_2$. Heating a closed vacuum-pumped ampoule had a negative effect on the amount of $Tm^{2+}$ in the final product. Therefore, during the melting process the ampoule was connected to a vacuum pump, which ensured that the pressure during the firing of the materials was around $10^{-4}$ mbar or lower. The samples made in this way were all black or greenish black and showed the desired $Tm^{2+}$ f-f emission. Besides the $Tm^{2+}$ doping, only very small amounts of $Tm^{3+}$ was present in some samples. On the basis of this recipe various $Tm^{2+}$ doped inorganic materials were fabricated. For example, for the synthesis of circa 1.5 g of 3% Tm doped $CaI_2$ the following recipe may be used:

mixing 1.425 g of $CaI_2$ with 0.063 g of $TmI_2$ inside a $N_2$ filled glove-box;

transferring the mixture into a dried quartz ampoule;

closing the ampoule inside the $N_2$ filled glove-box with a valve;

connecting the ampoule, with mixture and $N_2$ gas inside, to a vacuum pump;

vacuum pumping the ampoule;

heating the ampoule with a burner during vacuum pumping until the mixture melts (typically within 1 to 2 minutes).

stopping the heating, closing the ampoule by melting it, and disconnecting the ampoule from the pump once the quartz has cooled down.

opening the ampoule in the glove-box by breaking the quartz; and, forming a powder of the crystalline material.

On the basis of this fabrication methods $Tm^{2+}$ doped luminescent materials may be fabrications wherein the doping concentration of said $Tm^{2+}$ ions in said host material may vary selected between 0.1 and 100% depending on the ratio between the amount of $Tm^{2+}$-based salt and the inorganic host material. In an embodiment, the ratio may be selected such that the concentration of said $Tm^{2+}$ ions is between 1 and 50%, more preferably 1 and 30%. Hence, from the above, it follows that stable $Tm^{2+}$ doped crystalline materials in powder form may be synthesized by melting a stoichiometric mixture of salts under vacuum conditions, preferably at a pressure of $10^{-4}$ mbar or less. The crystalline material in powder form may be used in the formation of LSC devices, which will be described hereunder in more detail with reference to FIG. 9A-9C.

In some situations, it may be advantageous to use a material synthesis process that is compatible with convention thin-film semiconductor processing technologies so that the formation of crystalline $Tm^{2+}$ doped inorganic materials may be used together with other processing and/or material deposition steps. Hence, in addition to the above-described firing process for producing powder-based $Tm^{2+}$ doped inorganic materials, crystalline $Tm^{2+}$ doped inorganic materials were also synthesized on the basis of a semiconductor deposition technique. In particular, crystalline thin-film $Tm^{2+}$ doped layers were realized using a sputtering technique. In an embodiment, an RF magnetron co-sputtering technique may be used. In the co-sputtering technique, at least two targets may be used, e.g. a first target comprising an inorganic host material and a second Tm target.

Successful polycrystalline $Tm^{2+}$ doped thin-films of a thickness between 1 and 5 micron were grown on a suitable carrier substrate such as $SiO_2$ (quartz), $Al_2O_3$ or various types of glass under different sputtering conditions. In this particular example NaCl was used as the inorganic host material but other binary, ternary or quaternary host materials as described with reference to firing process may also be used without departing from the invention. The pressure during the sputtering process may be selected between 1 and 5 mTorr. The NaCl target was set at an RF power selected between 20 and 50 W (corresponding to a rate between 1 and 5 Å/s) and the Tm target was set at a DC power between 10 and 40 W (corresponding to a rate between 0.05 and 0.08 Å/s). On the basis of these setting, NaCl doped $Tm^{2+}$ films wherein the $Tm^{2+}$ dopant percentage is between 0.2 and 12% were realized (these values were determined on the basis of EDX measurements). Here a dopant percentage of 1% means that 1% of the cations in the anorganic host material is replaced by a $Tm^{2+}$ cation.

Figure 4B:
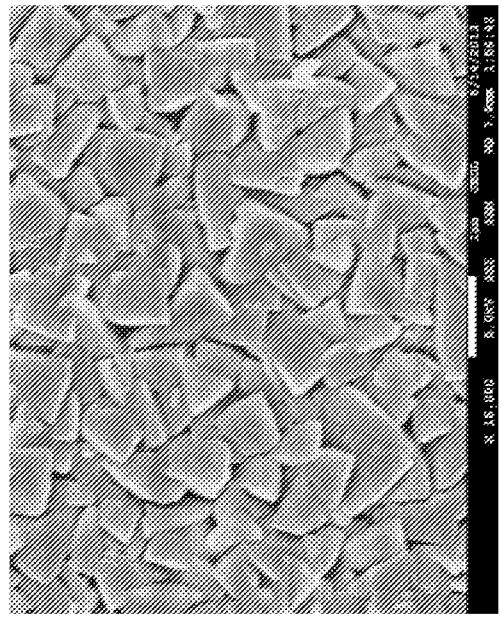
FIGS. 4A and 4B show SEM pictures of a crystalline Tm$^{2+}$ doped thin-film layers according to various embodiments of the invention.
Figure 4A:
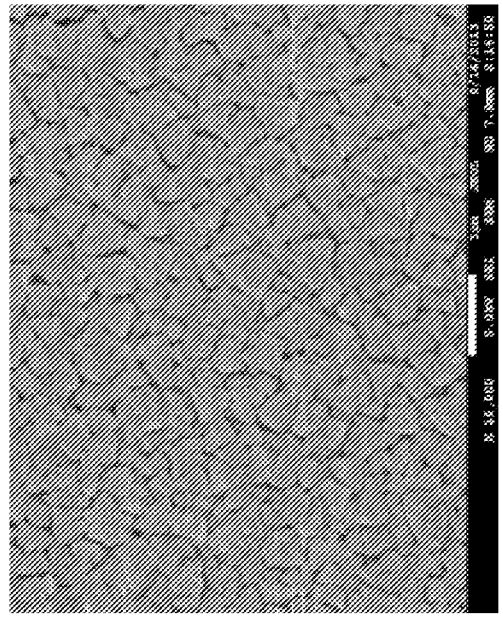

FIGS. 4A and 4B show SEM pictures of crystalline $Tm^{2+}$ doped thin-film layers according to various embodiments of the invention. In particular, FIGS. 4A and 4B show SEM pictures of crystalline $Tm^{2+}$ doped NaCl thin-film of a thickness of around 2 micron that were deposited onto an $SiO_2$ substrate at a temperature of 200° C. and 300° C. respectively. The presence of $Tm^{2+}$ in the NaCl film gives a greyish/tinted appearance (NaCl films are transparent). A similar effect was observed with the powders that turn from white to greyish/black when doped with $Tm^{2+}$. Polycrystalline films were grown wherein the grain size may be controlled by temperature. As shown in FIG. 4A, when using a deposition temperature 200° C. an average grain size between 200 and 400 nm may be realized. At a deposition temperature of 300° C. the average grain size is between 600 and 1000 nm as shown in FIG. 4B.

Figure 5:
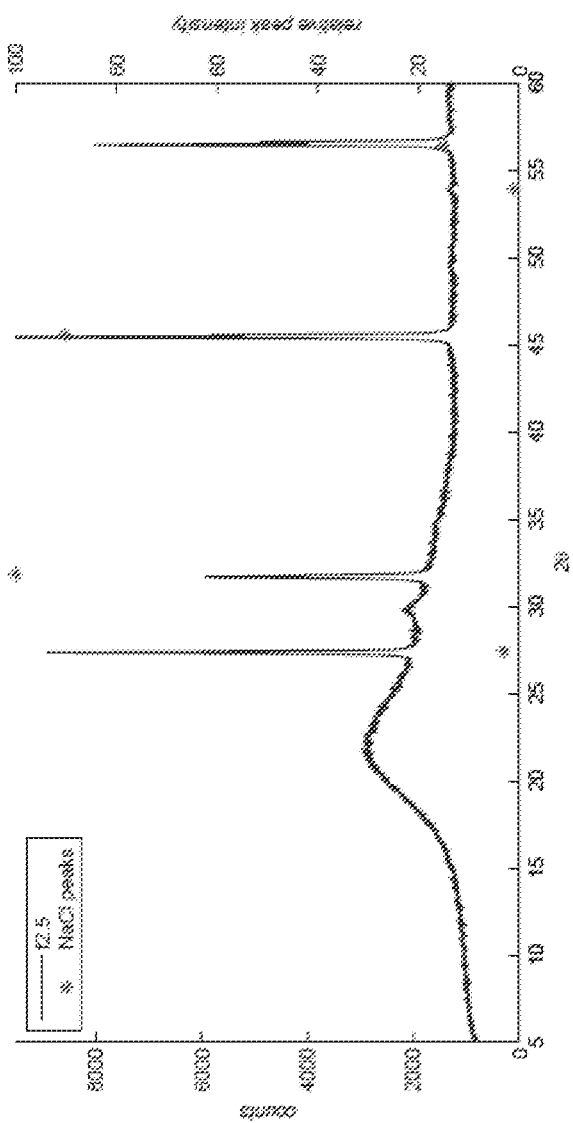
FIG. 5 depicts an XRD measurement of a sputtered Tm$^{2+}$ doped NaCl thin film according to an embodiment of the invention.
Figure 6:
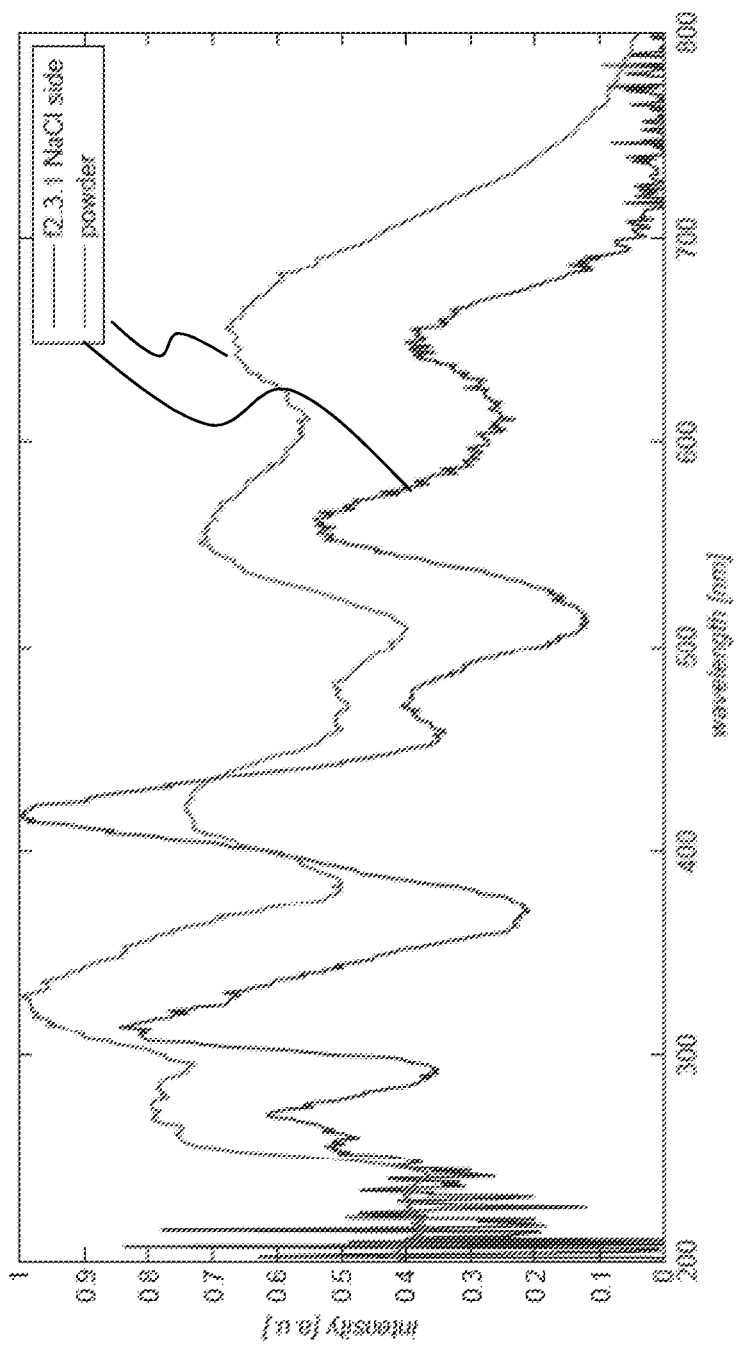
FIG. 6 depict excitation spectra of an Tm$^{2+}$:NaCl thin film and of a Tm$^{2+}$:NaCl powder sample according to an embodiment of the invention.

FIG. 5 depicts an XRD measurement of a sputtered $Tm^{2+}$ doped NaCl thin film according to an embodiment of the invention. The locations of the peaks in the spectrum match those of NaCl. FIG. 6 depict excitation spectra of an $Tm^{2+}$:NaCl thin-film and of a $Tm^{2+}$:NaCl powder sample. The spectra are recorded while monitoring the $Tm^{2+}$ line emission around 1140 nm. This figure shows that both the powder and thin-film materials comprise $Tm^{2+}$ that is responsible for absorption of light of the solar spectrum by one or more of its 5d energy bands. Further, it shows that if a $Tm^{2+}$ ion is excited in one of its 5d energy bands by photons of the solar spectrum, a radiation-less relaxation to a lower-level f band takes places before a line emission of photons at around 1138 nm takes place. Hence, the $Tm^{2+}$ doped thin-films exhibit a large Stokes-shift so that no overlap between emission and absorption is present.

Figure 7:
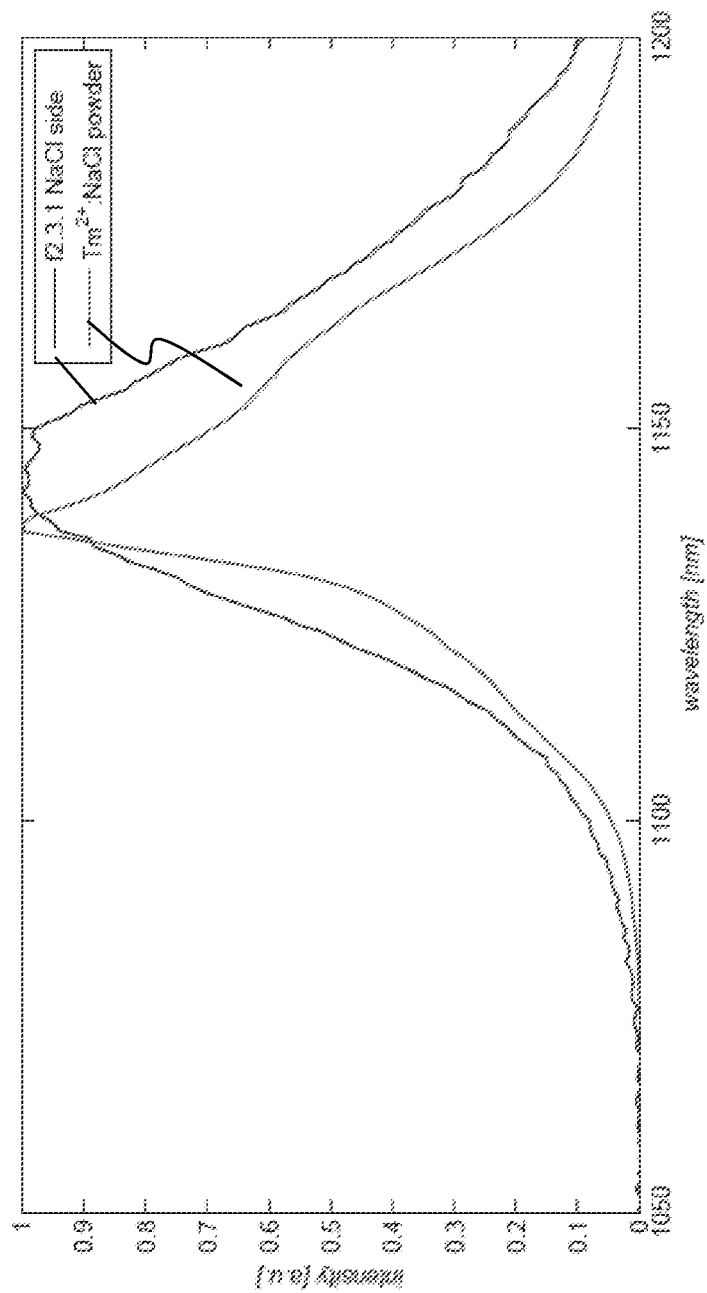
FIG. 7 depicts the emission spectrum of Tm$^{2+}$:NaCl thin-film and of a Tm$^{2+}$:NaCl powder sample.

FIG. 7 depicts the emission spectrum of $Tm^{2+}$:NaCl thin-film and of a $Tm^{2+}$:NaCl powder sample according to an embodiment of the invention. The spectra were recorded under excitation at 415 nm. This graph shows that for both the powder and thin-film samples, the $Tm^{2+}$ sites are responsible for the photon emission.

Figure 8:
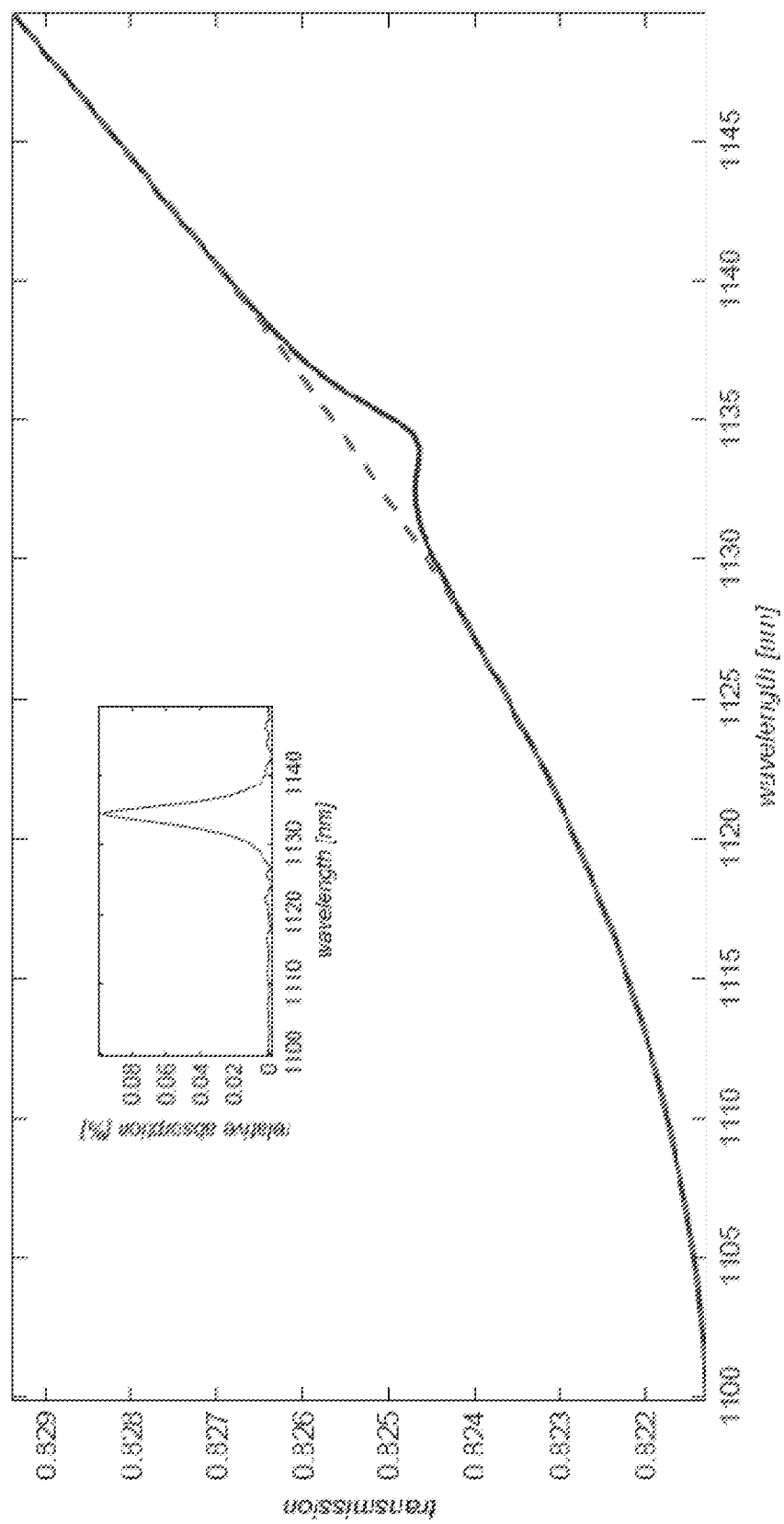
FIG. 8 depicts a fit of transmission spectrum of a Tm$^{2+}$ doped NaCl film around the 4f$^{13}$-4f$^{13}$ Tm$^{2+}$ absorption region.

FIG. 8 depicts a fit of transmission spectrum of a $Tm^{2+}$ doped NaCl film around the $Tm^{2+}$ absorption region. To quantify the absorption strength, the transmission excluding the dip is fitted and the amplitude of the dip with respect to this fitted line is determined. The inset shows the resulting relative absorption.

Alternative sputtering techniques may be used without departing from the invention. For example, in an embodiment a single target comprising a $Tm^{2+}$ doped target material that was synthesized using the firing method as described above. For example, an $Tm^{2+}$:NaCl or $Tm^{2+}$:$CaI_2$ powder may be synthesized and pressed into a tablet that can be inserted into the target of a sputtering system.

Figure 9A:
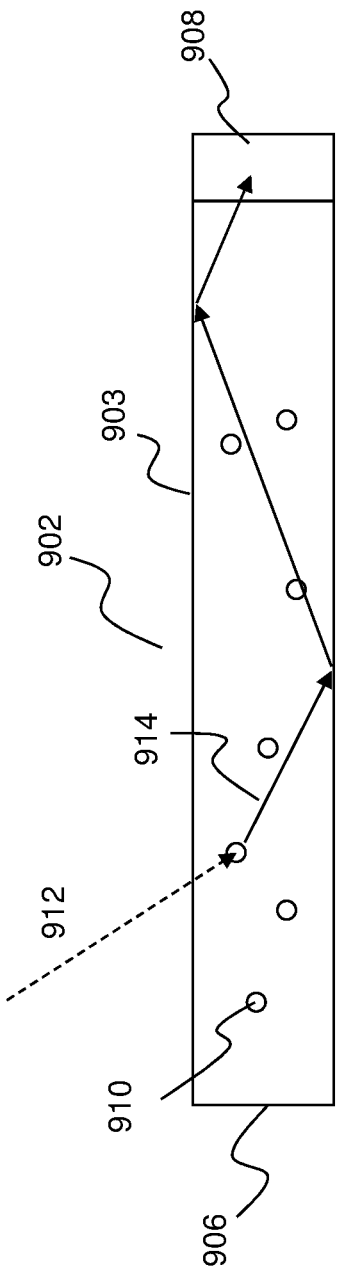
FIG. 9A-9C depict schematic cross-sections of luminescent solar energy concentrators comprising a Tm$^{2+}$ doped inorganic material according various embodiments of the invention.
Figure 9B:
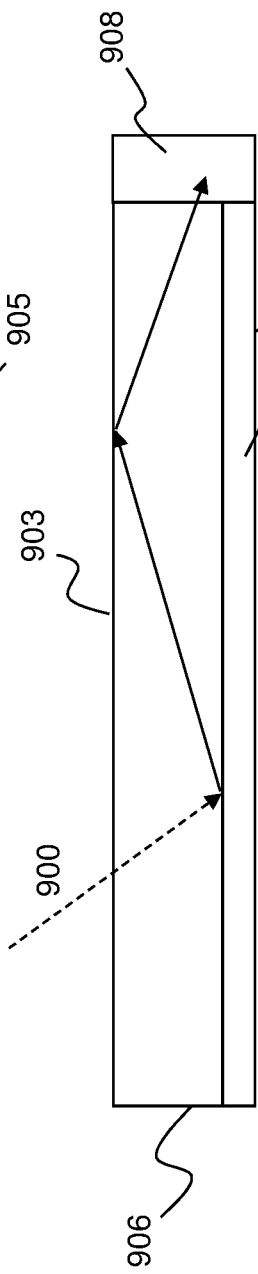
Figure 9C:
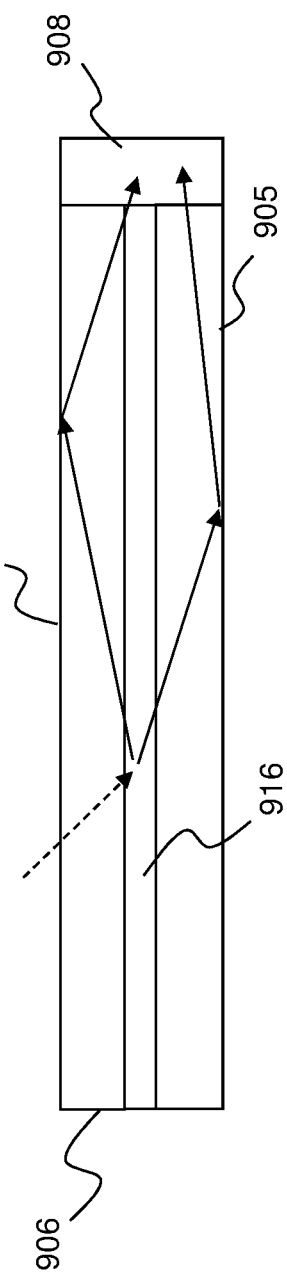

FIG. 9A-9C depict schematic cross-sections of solar radiation conversion devices, in particular luminescent solar energy concentrator devices, comprising a $Tm^{2+}$ doped inorganic material according various embodiments of the invention. FIG. 9A depicts a LSC device according to an embodiment of the invention. The LSC comprises a waveguide structure 902 comprising a first (top) surface 903, a second (bottom) surface 905 and one or more edges 906. At least part of the edges 906 of the waveguide structure may be coupled to a photovoltaic cell 908. In this embodiment, the waveguide structure may be formed of a transparent matrix material in which particles 910, preferably nano-scale particles, of a $Tm^{2+}$ doped inorganic crystalline material as described in this specification are embedded. When photons 912 from the solar spectrum that enter the waveguide structure are absorbed by one or more 5d energy bands of the $Tm^{2+}$ sites, the excited $Tm^{2+}$ sites transmit photons 914 via an ff-line emission at a wavelength of around 1138 nm. The emitted photons may be guided via the waveguide structure to the edges of the waveguide where a photovoltaic cell 908 that is optimized for converting the photons that are emitted by the Tm2+ ions into electrical power.

In an embodiment, the photovoltaic cell may be a Copper Indium Gallium (di)Selenide (CIGS) photovoltaic cell. In another embodiment, the photovoltaic cell may be an Copper Indium (di)Selenide (CIS) photovoltaic cell. These materials are very efficient for converting the emitted 1138 nm (near)infrared solar radiation of the $Tm^{2+}$ sites into electrical energy.

In a further embodiment, the photovoltaic cell may comprise a NIR/IR absorbing organic active layer or a NIR/IR dye-sensitized active layer. In an embodiment, the photovoltaic cell may comprise an organic semiconducting layer, e.g. MEH-PVV, that is sensitized with NIR/IR absorbing quantum dots. For example, by controlling the size of low-band gap (binary) semiconductors (e.g. PbS, PbSe, InAs and/or HgTe) quantum dots, the quantum dots may be tailored to absorb in the (near) infrared spectrum between 900 and 2000 nm. See e.g. Sargent et al in "Solution-based Infra-Red Photovoltaic Devices, Nature Photonics 3, 325-331 (2009). In another embodiment, the photovoltaic cell may comprise a (single) walled carbon nano-tube layer or a graphene active NIR/IR absorbing layer.

The $Tm^{2+}$ doped particles may be embedded in a transparent matrix material comprising a transparent organic polymer that has excellent transmittance properties in the near-infrared range of the optical spectrum such as poly (methyl methacrylate) (PMMA) or a polycarbonate. In an embodiment, the refractive index of the matrix material may be selected to substantially match the refractive index of the $Tm^{2+}$ doped particles so that losses due to scattering of the emitted light out of the waveguide structure is minimized.

FIG. 9B depicts a LSC device according to another embodiment of the invention. The LSC comprises a waveguide structure 902 comprising a first (top) surface 903, a second (bottom) surface 905 and one or more edges 906. At least part of the edges 906 of the waveguide structure may be coupled to a photovoltaic cell 908. The waveguide structure may be formed of a transparent high-index organic polymer or glass. At least part of the top and/or bottom surface of the waveguide structure may be covered with a luminescent layer 916 that may comprise a $Tm^{2+}$ doped inorganic crystalline material as described in this specification.

In an embodiment, the thin-film luminescent layer may be formed of a transparent matrix material in which particles, preferably nano-scale particles, of a $Tm^{2+}$ doped inorganic crystalline material are embedded. Alternatively, the optically active layer may be $Tm^{2+}$ doped (poly)crystalline thin-film layer that is formed on the waveguide structure. The thin-film layer may be formed onto the waveguide structure using e.g. a (co-)sputtering method as described above. The use of a (poly)crystalline layer that is coupled as an optically active layer to the waveguide structure provides the advantages that the effect of scattering that may occur when using a matrix layer comprising $Tm^{2+}$ doped particles is eliminated.

In a further embodiment (not shown), both at least part of the top surface and the bottom surface of the waveguide structure may be covered with a thin-film luminescent layer. This way, sunlight that passes the top and bottom side of the waveguide structure may be converted into (near) infrared light that is guided by the waveguide structure towards the photovoltaic cell.

FIG. 9C depicts a LSC device according to yet another embodiment of the invention. In this embodiment, the LSC device comprises one or more luminescent layers that are similar to the ones described with reference to FIG. 9B. In this embodiment however, the luminescent layer 916 is embedded in the waveguide structure 902.

It is submitted that the devices depicted in FIG. 9A-9C are non-limiting examples embodying the invention and many variations and/or combinations of features of these embodiments are possible without departing the invention. For example, in an embodiment, a solar radiation conversion device may comprise a waveguide structure comprising $Tm^{2+}$ doped luminescent layers that are provided over the first and/or second surface of the waveguide structure and embedded in the waveguide structure. In a further embodiment, at least part of the photovoltaic cell may be part of the waveguide structure.

FIGS. 10A and 10B depict cross-sections of schematic solar radiation conversion devices according to another embodiment of the invention. In particular, FIG. 10A depicts a solar radiation conversion device comprising a broadband-absorbing $Tm^{2+}$ luminescent conversion layer 1002 and a photovoltaic device 1004 comprising a first surface 1001 and second surface 1003. Depending on the configuration, the first (top) surface may be a light receiving surface. In case of a transparent solar cell, both the first and second surface may be light receiving surfaces. The conversion layer may be coated or deposited on the first and/or second surface. In an embodiment, the conversion layer may be a thin-film (poly)crystalline $Tm^{2+}$ doped luminescent material as described in this disclosure with reference to FIG. 4-8. In another embodiment, the conversion layer may be a transparent matrix material comprising particles, preferably nano-particles, of a $Tm^{2+}$ doped luminescent material as descried in this disclose.

In an embodiment, the photovoltaic device may be silicon photovoltaic device, e.g. an micro-crystalline (thin-film) silicon photovoltaic device. In an another embodiment, the photovoltaic device may be an NIR/IR photovoltaic cell (single or multi-junction) for converting at least the (near) infrared part of the solar spectrum 1006 into electric power. Further, light from the UV and visible part 1008 of the solar spectrum is converted by the broadband-absorbing $Tm^{2+}$ luminescent conversion layer 1002 into 1138 nm infrared solar radiation.

FIG. 10B depicts a solar radiation conversion device, e.g. a solar sell, comprising a broadband-absorbing $Tm^{2+}$ luminescent material. The device may comprise a substrate 1012, preferably a transparent substrate, comprising a multi-layered thin-film photovoltaic device. The photovoltaic device may comprise a first contact layer 1014 formed on a first surface of the substrate. A solar radiation absorbing active layer or multilayer 1018 is formed over the first contact layer and a second layer 1016 is formed over the active layer.

In an embodiment, the photovoltaic device may comprise at least one layer comprising infrared absorbing quantum dots (i.e. nano-particles having a size such that quantum-confinement effects are induced in the particles, i.e. reducing the size of the particles to less than the Bohr radius of the electron and hole functions in the semiconductor) and nano-particles of a broadband-absorbing $Tm^{2+}$ luminescent material as described in this disclosure. In an embodiment, the size of at least part of the infrared absorbing quantum dots may be optimized for absorption of infrared solar radiation that is transmitted by the $Tm^{2+}$ luminescent nano-particles. For example, PbS quantum dots that have a particle size of around 3-4 nm will absorb (near) infrared radiation around 900-111 nm. Hence, in this embodiment an infrared part 1006 of the solar radiation may be absorbed directly by infrared absorbing quantum dots while the UV and the visible part of the solar radiation may be converted by the $Tm^{2+}$ luminescent nano-particles into infrared solar radiation 1010 of a wavelength of around 1138 nm. This way, the overall conversion efficiency of a simple infrared photovoltaic device may be extended on the basis of visible solar radiation that is converted into infrared solar radiation.

In another embodiment, the photovoltaic device may comprise further comprise a further broadband-absorbing $Tm^{2+}$ luminescent (poly)crystalline thin-film layer. Such layer may be positioned between the substrate and the first contact layer in order to increase the transformation of the radiation of the UV/visible part of the solar spectrum into radiation of the infrared part of the solar spectrum.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A solar radiation concentrating device comprising: a transparent waveguide structure comprising a top surface, a bottom surface and one or more edges, the top surface being configured to receive solar radiation; and a photovoltaic device coupled to at least one of the one or more edges of the transparent waveguide structure;

the transparent waveguide structure comprising a luminescent thin-film layer provided over a transparent substrate, the luminescent thin-film layer including a luminescent $Tm^{2+}$ doped inorganic material exhibiting broadband absorption of light in UV range of solar radiation and broadband absorption of light in visible range of the solar radiation, wherein at least 60% of the solar radiation is absorbed by the luminescent layer;

wherein the solar radiation absorbed by the luminescent layer is emitted by the luminescent layer as infrared radiation having a wavelength of between about 1100 nm and about 1200 nm; and wherein the transparent waveguide structure is configured to guide the infrared radiation to the photovoltaic device which is configured to convert at least part of the infrared radiation into electrical power; and wherein host material of the luminescent $Tm^{2+}$ doped inorganic material consists of binary or quaternary inorganic crystalline host material.

2. The solar concentrating device according to claim 1, wherein the host material is binary inorganic crystalline host material.

3. The solar concentrating device according to claim 2, wherein the $Tm^{2+}$ ions are present in the host material in a concentration between 0.1 and 100%.

4. The solar radiation conversion device according to claim 2,
wherein the binary inorganic crystalline host material is defined by the general formula ML, wherein M=Na,K,Rb,Cs and L=Cl,Br,I,F; or,
wherein the binary inorganic crystalline host material is defined by the general formula $NL_2$ wherein N=Mg,Ca,Sr,Ba and L=Cl,Br,I,F; or.

5. The solar radiation conversion device according to claim 1, wherein the luminescent thin-film layer is a (poly) crystalline thin-film layer.

6. The solar concentrating device according to claim 1, wherein the luminescent layer is embedded in the transparent waveguide structure.

7. The solar concentrating device according to claim 1, wherein at least part of the luminescent layer is provided over a light-receiving face of said photovoltaic device.

8. The solar concentrating device according to claim 1, wherein photovoltaic device comprises the $Tm^{2+}$ based inorganic material.

9. The solar concentrating device according to claim 1, wherein the photovoltaic device comprises an infrared absorbing active layer, the infrared absorbing active layer comprising at least one of: a type IV, III-V, or II-VI semiconductor compound, copper indium gallium (di)selenide (CIGS), copper indium (di)selenide (CIS), infrared absorbing quantum dots, an infrared absorbing polymer, graphene or (carbon) nanotubes.

10. The solar concentrating device according to claim 1, wherein the $Tm^{2+}$ ions are present in a concentration between 1% and 50%.

11. The solar concentrating device according to claim 1, wherein the $Tm^{2+}$ ions are present in a concentration between 1% and 30%.

12. The solar concentrating device according to claim 1, wherein the $Tm^{2+}$ ions are present in a concentration between 0.2% and 11%.

13. The solar concentrating device according to claim 1, wherein the luminescent layer is a sputtered or a co-sputtered $Tm^{2+}$ doped thin-film layer.

14. The solar concentrating device according to claim 1, wherein the luminescent layer comprises a matrix material in which $Tm^{2+}$ doped particles are embedded.

15. The solar concentrating device according to claim 14, wherein the $Tm^{2+}$ doped particles have average dimensions between 1 and 1000 nm.

16. The solar concentrating device according to claim 14, wherein the matrix material is a transparent organic polymer.

17. The solar concentrating device according to claim 16, wherein the transparent organic polymer is a poly(methyl methacrylate) (PMMA) or a polycarbonate.

18. A solar radiation concentrating device comprising: a transparent waveguide structure comprising a top surface, a bottom surface and one or more edges, the top surface being configured to receive solar radiation; and
a photovoltaic device coupled to at least one of the one or more edges of the transparent waveguide structure;
the transparent waveguide structure comprising a luminescent layer, the luminescent layer including particles of a luminescent $Tm^{2+}$ doped inorganic material having average dimensions between 1 and 1000 nm, the luminescent $Tm^{2+}$ doped inorganic material exhibiting broadband absorption of light in UV range of solar radiation and broadband absorption of light in visible range of the solar radiation;
wherein solar radiation absorbed by the luminescent layer is emitted by the luminescent layer into infrared radiation having a wavelength of between about 1100 nm and about 1200 nm;
wherein the transparent waveguide structure is configured to guide the infrared radiation to the photovoltaic device which is configured to convert at least part of the infrared radiation into electrical power; and
wherein host material of the luminescent $Tm^{2+}$ doped inorganic material consists of binary or quaternary inorganic crystalline host material.

19. The solar concentrating device according to claim 18, wherein the infrared radiation has a peak emission at a wavelength of around 1138 nm.

20. The solar concentrating device according to claim 1, wherein the infrared radiation has a peak emission at a wavelength of around 1138 nm.

21. A solar radiation concentrating device comprising:
a transparent waveguide structure comprising a top surface, a bottom surface and one or more edges, the top surface being configured to receive solar radiation; and
a photovoltaic device coupled to at least one of the one or more edges of the transparent waveguide structure;
the transparent waveguide structure comprising a luminescent layer, the luminescent layer including a luminescent $Tm^{2+}$ doped inorganic material exhibiting broadband absorption of light in UV range of solar radiation and broadband absorption of light in visible range of the solar radiation;
wherein the UV light and visible light absorbed by the luminescent layer is emitted by the luminescent layer as infrared radiation having a wavelength of between about 1100 nm and about 1200 nm;
wherein the transparent waveguide structure is configured to guide the infrared radiation to the photovoltaic device which is configured to convert at least part of the infrared radiation into electrical power; and
wherein host material of the luminescent $Tm^{2+}$ doped inorganic material consists of binary or quaternary inorganic crystalline host material.

22. The solar concentrating device according to claim 21, wherein the infrared radiation has a peak emission at a wavelength of around 1138 nm.

* * * * *